United States Patent [19]
Hanes et al.

[11] Patent Number: 5,198,695
[45] Date of Patent: Mar. 30, 1993

[54] SEMICONDUCTOR WAFER WITH CIRCUITS BONDED TO A SUBSTRATE

[75] Inventors: Maurice H. Hanes, Murrysville; Rowland C. Clarke, Bell Township; Michael C. Driver, Elizabeth Township, all of Pa.

[73] Assignee: Westinghouse Electric Corp., Pittsburgh, Pa.

[21] Appl. No.: 624,783

[22] Filed: Dec. 10, 1990

[51] Int. Cl.⁵ .............. H01L 23/48; H01L 29/44; H01L 29/54; H01L 29/60
[52] U.S. Cl. ..................... 257/773; 257/747; 257/774; 257/779; 257/757; 257/766
[58] Field of Search .............. 357/68, 71, 65, 80, 357/75, 81

[56] References Cited

U.S. PATENT DOCUMENTS

| | | | |
|---|---|---|---|
| 3,458,925 | 8/1969 | Napier et al. | 357/68 |
| 3,585,713 | 6/1971 | Kaneda et al. | 357/68 |
| 3,604,989 | 9/1971 | Haneta et al. | 357/68 |
| 3,648,131 | 3/1972 | Stuby | 357/68 |
| 3,761,782 | 9/1973 | Youmans | 357/68 |
| 3,787,252 | 1/1974 | Filippazzi et al. | 357/68 |
| 3,986,251 | 10/1976 | Altemus et al. | 29/590 |
| 4,023,725 | 5/1977 | Ivett et al. | 228/123 |
| 4,823,136 | 4/1989 | Nathanson et al. | 342/368 |
| 5,027,189 | 6/1991 | Shannon et al. | 357/71 |

FOREIGN PATENT DOCUMENTS

WO82/02457 7/1982 PCT Int'l Appl.

Primary Examiner—Andrew J. James
Assistant Examiner—Carl Whitehead, Jr.
Attorney, Agent, or Firm—David G. Maire

[57] ABSTRACT

A bonded structure is described consisting of a semiconductor wafer, preferably gallium arsenide, soldered to a substrate material. A method for forming the structure is also described. The structure provides mechanical support and thermal conductivity for the wafer, as well as a multitude of connections through the substrate material at predetermined locations on the wafer. The substrate material and the soldering process are selected to minimize the resulting stresses in the wafer. A pattern of pads consisting of a refractory metal covered by a solder material is formed on the substrate to maintain space for excess solder in order to avoid the shorting of the individual connections on the wafer, and to control the size and location of voids in the solder upon solidification.

12 Claims, 3 Drawing Sheets

SEMICONDUCTOR WAFER WITH CIRCUITS BONDED TO A SUBSTRATE

BACKGROUND OF THE INVENTION

This invention relates to the general field of microelectronics, and in particular to the technology of bonding substrate materials to semiconductor wafers containing circuitry.

The attachment of monolithic integrated circuits to electrical headers is an important and difficult process. The substrate material forming the header provides mechanical support for the fragile wafer, as well as a thermal path for removing heat generated by the circuits formed on the wafer. Recently, wafer scale integration has been used for interconnecting numerous circuits on an single wafer, thereby making use of an entire wafer for one application; for example, U.S. Pat. No. 4,823,136 to Nathanson et al. entitled "Transmit-Receive Means for Phased-Array Active Antenna System Using RF Redundancy." Wafer scale integration compounds the mounting and thermal stress problems, and can require numerous interconnections between various portions of the wafer, and between the wafer and circuitry separate from the wafer for power and signal takeoffs.

The attachment process for gallium arsenide wafers has traditionally been accomplished by providing a thick gold metalization to the inactive side of the wafer, as well as to the top of the substrate material. The two metallized surfaces are then joined with a solder whose composition is essentially 80 wt. % gold and 20 wt. % tin. In addition to the obvious cost of working with thick layers of gold, this process often yields poor results due to the high temperature and resulting high stress levels induced into the gallium arsenide wafer. The melting temperature of 80/20 gold/tin solder is approximately 280° C. The temperature required for good solder flow is even higher because as the solder combines with the gold metalization on the gallium arsenide wafer and the substrate, the liquids temperature increases. Differential expansion of the gallium arsenide wafer and the substrate material can severely stress the wafer, resulting either in immediate cracking of the wafer or in reduced long term stability of the circuit or device. The use of solder having a composition of 10 wt. % gold and 90 wt. % tin allows the use of a lower melting temperature (approximately 217° C.), however, such a solder rapidly forms higher melting point intermetallic compounds, such as $AuSn_4$ which are not suitable for soldering. Another problem with the standard soldering technique is that excess solder can be squeezed laterally across the surface of the wafer to areas where it is not intended to make contact, causing failures of the circuit through electrical shorts. Furthermore, the voids which are inevitably generated a the molten solder solidifies and shrinks in volume can coalesce, leaving large void areas which constitute regions of low thermal conductivity and inhomogeneous stress distribution.

Similar bonding problems have been encountered in the field of silicon wafer devices. For silicon devices, improved processes have been developed by using various combinations of materials for both the metalization layers and the solder material. For example, Finn et al., in PCT International Publication Number WO 82/02457, disclose a two layer metalization of the silicon wafer, using first chromium then gold or an alternative material. The wafer is then soldered to the metal, or metallized, substrate using a tin preform, heated in an inert atmosphere. Ivett et al., in U.S. Pat. No. 4,023,725, disclose the use of a two layer metalization of the silicon wafer, using first silver or titanium then a thin layer of rhodium or an alternative material. The wafer is then soldered to the substrate with a lead based solder. These processes, developed specifically for silicon based devices, require soldering temperatures of 275°–315° C.

Progress in the technology for bonding gallium arsenide wafers to substrate materials has been limited. Altemus et al, in U.S. Pat. No. 3,986,251, disclose a process for bonding gallium-type devices to a metallized substrate. The gallium wafer undergoes a surface preparation process, then it is metallized with either gold-germanium or gold-silicon and heated at 370° C. in a forming gas to alloy the metallized layer to the wafer. A second, similar layer is then applied over the first alloyed layer. The wafer is then separated into individual chips or circuits, and the chips are eutectically bonded to the metallized substrate surface at 500° C. in an ambient atmosphere. This process is not directed toward wafer scale integration applications.

To overcome the problems and limitations associated with the above described techniques, it is the object of this invention to provide a wafer to substrate bond wherein the resulting stresses in the wafer are lower than previously obtainable, while maintaining excellent mechanical support and high heat transfer capability within the bonded structure.

Another object of this invention is to provide a wafer to substrate bond without the use of significant amounts of gold or other precious metals.

Another object of this invention is to bond an entire wafer of three inch diameter or larger to a substrate material while providing for numerous points of low-ohmic electrical attachment at predetermined locations on the wafer for making electrical connections through the substrate for both power and signal leads.

SUMMARY OF THE INVENTION

Disclosed herein is a bonded structure consisting of a semiconductor wafer, preferably gallium arsenide, and a substrate material, separated and bonded together by pads consisting of a layer of a refractory metal and a layer of a solder material. The substrate material, preferably alumina or other material having a coefficient of thermal expansion close to that or the wafer, provides mechanical support for the wafer, as well as a path for the transfer of heat generated electrical devices formed on the wafer. In addition the substrate has numerous isolated low-ohmic election attachments to predetermined locations on the wafer which facilitate the supply of power and signals to and from the circuitry formed on the wafer.

To form the disclosed bonded structure, a substrate material is prepared by laser drilling numerous vias through the substrate material at predetermined locations which correspond to locations of vias on the wafer, which in turn correspond to predetermined connection points on the circuitry formed on the wafer. The bottom of the substrate material and the inside of the substrate vias are then plated with metal to provide isolated connection surfaces around each of the vias. The top of the substrate material has formed upon it a pattern of pads. The pads each consist of a layer of refractory metal, preferably nickel, and a layer of a solder material preferably tin. The pads are separated by spaces such that when the solder is melted and the gallium arsenide wafer is pressed onto the substrate material, the excess solder is contained within the spaces between the pads. The refractory metal maintains spacing between the wafer and the substrate during the bonding process, thus limiting the spread of the solder material and preventing undesirable shorting between via holes, as well as preventing the formation of large voids in the solder when it cools and contracts. The pattern of location of the pads varies across the bonded structured the pads being more closely spaced in areas under sources of heat on the wafer, and being less closely spaced near the vias.

DESCRIPTION OF THE PREFERRED EMBODIMENT

Figure 1:
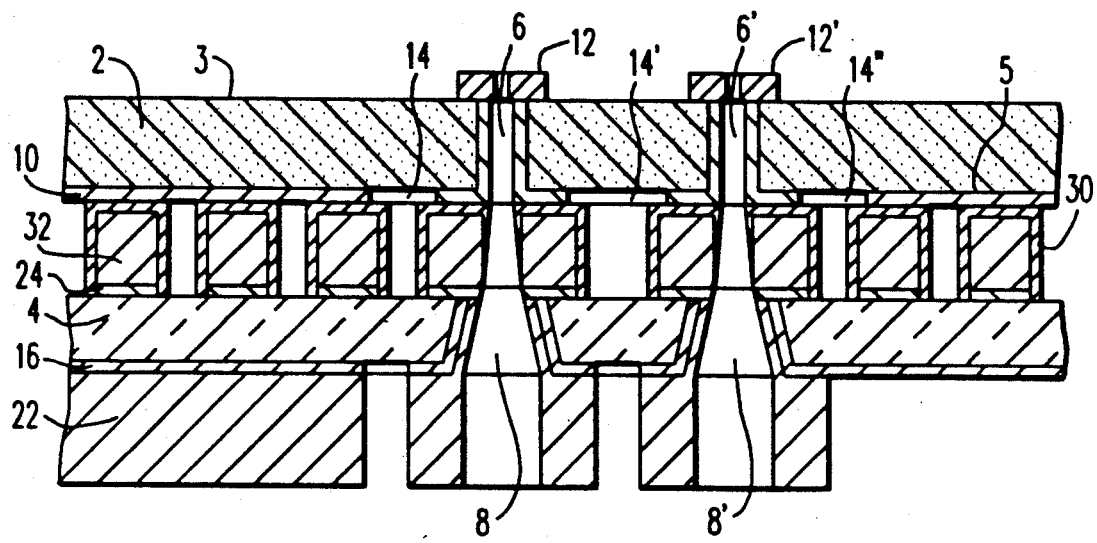
FIG. 1 is a cross sectional view of the preferred embodiment of the disclosed semiconductor wafer bonded to a substrate material.

The preferred embodiment of this invention is shown in FIG. 1, where a semiconductor wafer 2 is joined to a substrate material 4.

Figure 2:
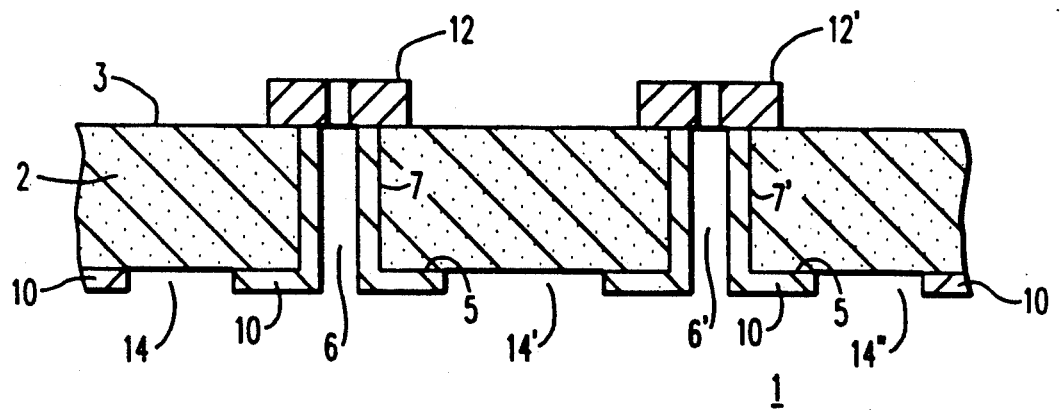
FIG. 2 is a cross sectional view of the wafer of FIG. 1 at an interim point of fabrication.
Figure 3:
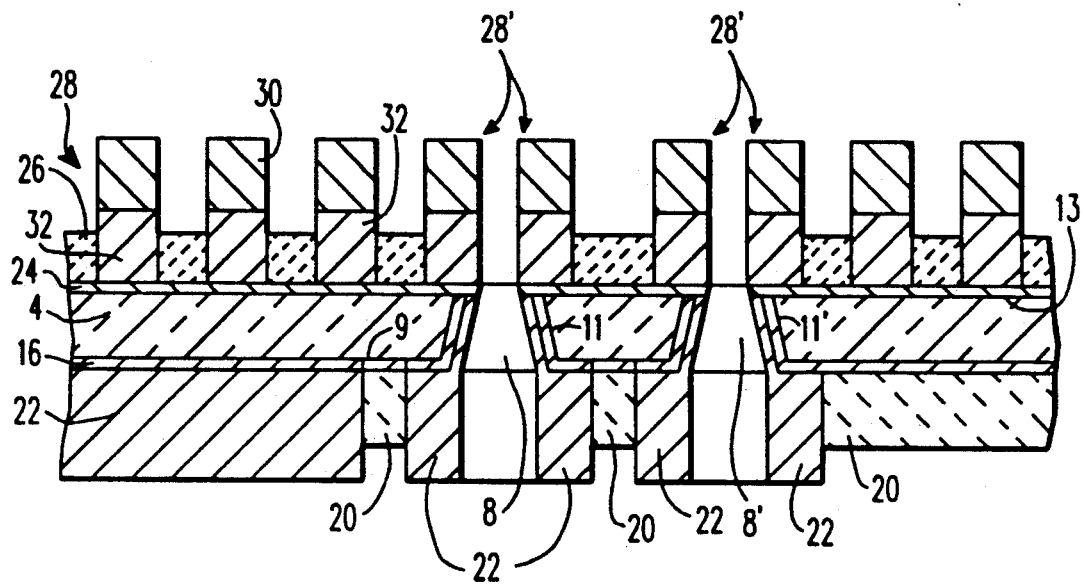
FIG. 3 is a cross sectional view of the substrate of FIG. 1 at an interim point of fabrication.
Figure 4:
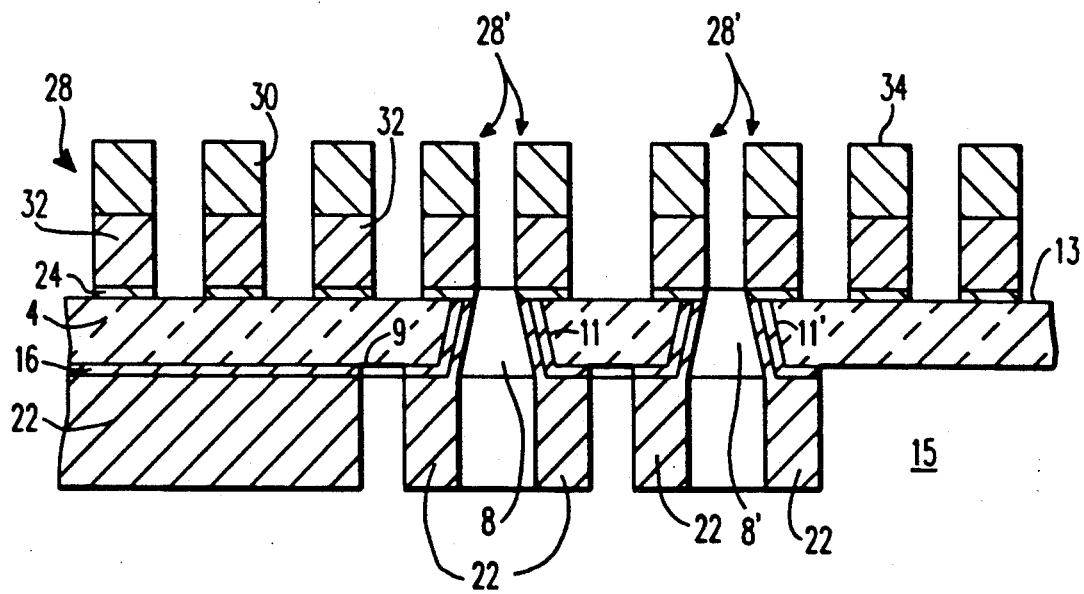
FIG. 4 is a cross sectional view of the substrate of FIG. 1 prior to bonding to the wafer.

Steps in the preparation of the semiconductor wafer structure are illustrated in FIGS. 2 through 4. A semiconductor wafer, preferably a gallium arsenide wafer 2, contains electrical circuits (not shown) formed on the top surface 3 of the wafer. These electrical circuits (not shown) include multiple connection points which are terminated in metallized areas 12, 12'. The gallium arsenide wafer 2 is thinned to a predetermined thickness, typically on the order of 0.010", to obtain desired dielectric properties according to the circuit design requirements. Vias 6, 6' are formed in the gallium arsenide wafer 2 by a precision drilling technique such as laser drilling followed by chemical enlargement of the drilled hole to a diameter of approximately 100 microns. The vias are formed at predetermined locations which correspond to the electrical connection points at the metallized areas 12, 12' on the top surface 3 of the gallium arsenide wafer 2. A metalization layer 10 is then applied to the entire bottom surface 5 of the gallium arsenide wafer 2 and the inside surfaces 7, 7' of the vias 6, 6'. The metalization layer 10 preferably consists of a 100 Å layer of palladium deposited by an electroless process and a 10 micron layer of gold deposited by electroplating. The palladium serves as the electrical conductor for the gold electroplating, and the gold provides a good bonding surface for subsequent soldering. The thickness of the metalization layer 10 is selected to minimize the amount of precious metal required while still providing low ohmic conductivity through the gallium arsenide wafer 2 at the vias 6, 6'. Electrical isolation of the areas of metalization around each of the vias is accomplished by chemical etching of selected areas 14, 14', 14" of the bottom surface of the gallium arsenide wafer 2 to remove the metalization layer 10.

Figure 5:
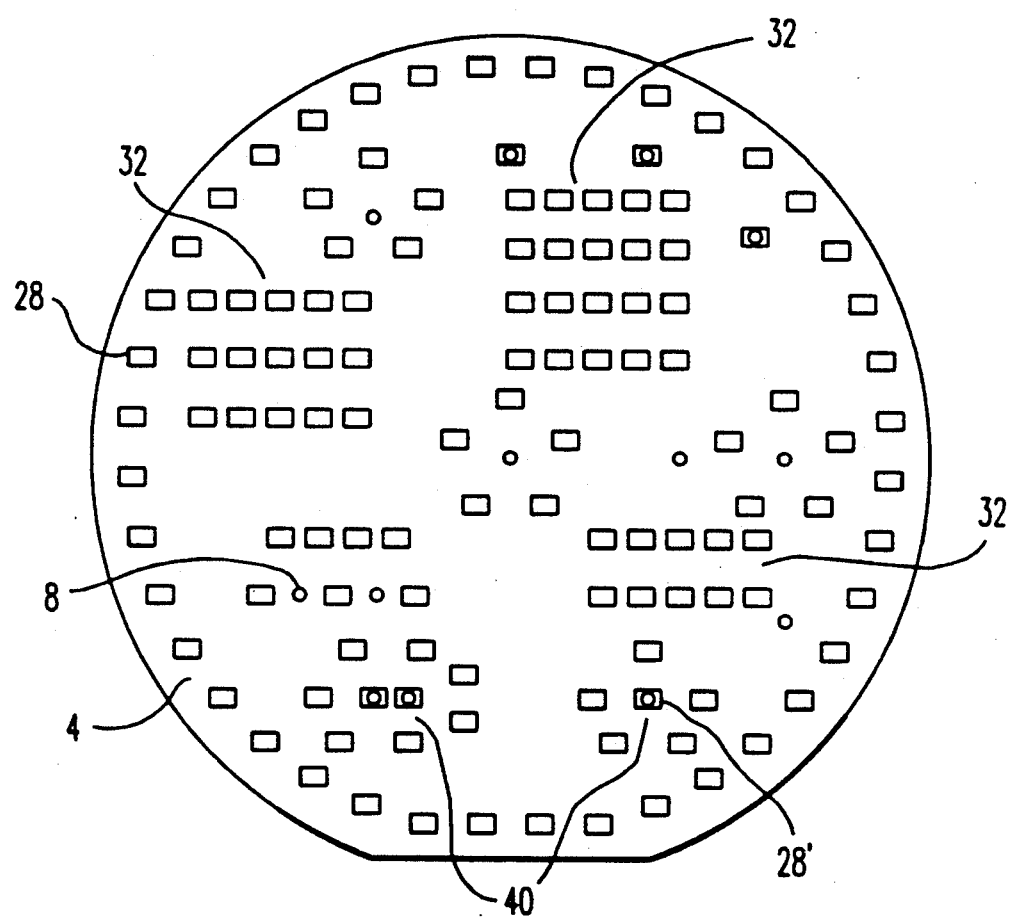
FIG. 5 is a top view of the substrate showing a pattern of pads and vias.

FIG. 3 shows details of the process for preparing the substrate material 4 prior to bonding with the wafer. The material used for the substrate is selected to have a thermal coefficient of expansion which is equal to or slightly greater than that of the wafer. For gallium arsenide applications, preferred substrate materials include alumina ($Al_2O_3$) and silicon carbide aluminum (SiCAl). Vias 8, 8' are formed at multiple locations in the substrate material 4 corresponding to the locations of the vias 6, 6' in the gallium arsenide wafer shown in FIG. 1. The bottom surface 9 of the substrate material 4 is metallized to form a conductive layer 16. The conductive layer 16 may typically consist of 200 Å of chromium and 2000 Å of copper deposited by sputtering. It is desired that some of this metal is deposited on the inside surfaces 11, 11' of the via holes 8, 8' in the substrate material 4. In the event that the aspect ratio (substrate thickness divided by hole diameter) is too high to permit the formation of a complete conductive path through each via, an electroless process or a thick film metalization paste can be used. A pattern of photoresist material 20 is applied over the conductive layer 16. The photoresist is developed out of the vias 8, 8' so that plating of the vias can occur. A layer of electroplated metal 22 is then applied to those areas not protected by the photoresist material 20. The layer of electroplated metal 22 consists preferably of several microns of copper, 5000 Å of nickel, and 1000 Å of gold. The copper functions as the electrical conductor, the nickel is a solder barrier against subsequent soldering operations, and the gold maintains an oxide-free surface on the nickel. The gold is present in such a small amount relative to the other metals that it plays an insignificant role in the solder metallurgy. The top surface 13 of the substrate material 4 is then vacuum metallized. This metallized layer 24 consists preferably of 300 Å of titanium and 2000 Å of gold. The titanium serves to form a strong metallic bond to the substrate, and the gold acts as a highly conductive surface for subsequent electroplating operations. A pattern of photoresist material 26 is applied over the metallized layer 24. The pattern is designed to open holes to create a field of pads 28, including pads 28' which surround the vias 8, 8'. FIG. 5 is a top view of a substrate material 4 showing a typical pattern of pads 28, 28' and vias 8. The pads are more closely spaced in areas of high thermal fluence 32 located under heat generating devices (not shown). The pads are spaced farther apart in areas 40 near the vias where thermal fluence is low, but where it is desirable to avoid electrical shorts caused by the flow of excess solder. The pads may take any shape, but they are preferably shown as rectangular. Referring again to FIG. 3, the bottom of the substrate material 4 is covered with protective material such as plating resist or an adhesive plastic film (not shown) to prevent further electroplating on that surface. The pads 28, 28' are formed by electroplating over the metallized layer 24 in those areas not protected by the photoresist material 26 or the protective material (not shown). The pads consist preferably of a layer of nickel 32 or other refractory metal followed by a layer of tin 30 or other solder material. The relative thicknesses of the nickel 32 and the tin 30 is determined by the spacing of the pads, and may typically be 13 microns of nickel and 10 microns of tin. The thickness of the tin is selected to accommodate any irregularities in the wafer or substrate surfaces The protective material (not shown) on the bottom of the substrate material 4 and the photoresist 20 and 26 are removed from the surfaces of the substrate material 4. Both surfaces are then ion milled. This process removes the exposed portions of the thin layers of metals 16 and 24 which were used as cathodes during the electroplating The resulting substrate structure 15, shown in FIG. 4, has electrically isolated pads 28 and electrically conductive paths through each of the vias 8, 8'. The substrate structure 15 is heated in a reducing gas atmosphere, preferably $H^2$, $N^2$, or HCl, to ensure that pure tin exists at the surface of the pads 34. The assembly is then heated to over 232° C. in order to melt the tin layer 30 of the pads 28, and the gallium arsenide wafer structure 1 from FIG. 2 is pushed against the substrate structure 15 in a special fixture which assures the alignment of the wafer vias 6, 6' and the substrate vias 8, 8'. The molten tin 30 flows around the nickel 32 as shown in FIG. 1. The refractory metal remains solid during the bonding process, thus controlling the flow of the solder material and preventing both the shorting between vias and the formation of large voids as the solder solidifies. The assembly is allowed to cool and the tin solidifies, completing the bonding operation.

We claim:

1. A bonded semiconductor wafer device, comprising:
   a semiconductor wafer having a top and a bottom surface, said wafer containing circuitry on its top surface;
   a substrate having a top and a bottom surface;
   a bonding means operable to join the bottom surface of said wafer to the top surface of said substrate, said bonding means further comprising a plurality of individual pads of bonding material separated by spaces and arranged in a predetermined pattern, said pads comprising a layer of refractory metal and a layer of solder material, wherein said spaces contain said solder material when said wafer and said substrate are joined; and
   an interconnection means operable to provide electrical connection between said circuitry and a predetermined point of said bottom surface of said substrate.

2. A device as in claim 1, wherein said interconnection means comprises the metallized surface of a via formed through said substrate and said wafer at the location of one of said pads.

3. A device as in claim 1, further comprising said substrate having a thermal coefficient of expansion which is the same or greater than that of said wafer.

4. A device as in claim 1, further comprising said wafer being gallium arsenide and said substrate being alumina.

5. A device as in claim 1, further comprising said wafer being gallium arsenide and said substrate being silicon carbide aluminum.

6. A device as in claim 1, wherein said pads are more densely spaced opposed a heat generating portion of said circuitry, and less densely spaced near said interconnection means.

7. A device as in claim 1, further comprising said solder material being tin.

8. A device as in claim 1, further comprising said refractory metal being nickel.

9. A bonded semiconductor wafer device, comprising a semiconductor wafer, a substrate, and a plurality of individual bonding pads joining said wafer and said substrate, each said pad comprising a very of refractory metal and a layer of solder material, said pads being separated by spaces which contain the flow of said solder material when said wafer and said substrate are bonded.

10. A device as in claim 9, further comprising an electrical interconnection between the non-bonded surfaces of said wafer and said substrate, said interconnection comprising a via formed through one said pad.

11. A device as in claim 10, further comprising a heat generating device formed on the non-bonded surface of said wafer, wherein said pads are more closely spaced opposed said heat generating device and are less closely spaced near said interconnection.

12. A device as in claim 9, further comprising said refractory metal comprising nickel and said solder material comprising tin.

* * * * *